(12) United States Patent
Taliani et al.

(10) Patent No.: US 8,343,797 B2
(45) Date of Patent: Jan. 1, 2013

(54) PROCESS FOR PREPARING A SOLAR CELL

(76) Inventors: Carlo Taliani, Bologna (IT); Petr Nozar, San Lazzaro di Savena (IT)

( * ) Notice: Subject to any disclaimer, the term of this patent is extended or adjusted under 35 U.S.C. 154(b) by 357 days.

(21) Appl. No.: 12/681,532

(22) PCT Filed: Sep. 17, 2008

(86) PCT No.: PCT/EP2008/062383
§ 371 (c)(1),
(2), (4) Date: Jul. 9, 2010

(87) PCT Pub. No.: WO2009/043725
PCT Pub. Date: Apr. 9, 2009

(65) Prior Publication Data
US 2010/0282319 A1    Nov. 11, 2010

(30) Foreign Application Priority Data
Oct. 4, 2007   (IT) .............................. MI2007A1907

(51) Int. Cl.
*H01L 21/00* (2006.01)
(52) U.S. Cl. ........ 438/86; 438/93; 438/95; 257/E27.123
(58) Field of Classification Search .................... 438/84, 438/86, 93–95; 257/E27.123
See application file for complete search history.

(56) References Cited

U.S. PATENT DOCUMENTS 4,764,261 A * 8/1988 Ondris et al. ................ 205/170
6,137,048 A   10/2000 Wu et al.
6,852,614 B1  2/2005 Compaan et al.

OTHER PUBLICATIONS

Godines, J.A., et al., "Comparative Secondary Ion Mass Spectroscopy Analysis of Solar Cell Structures Grown by Pulsed Laser Ablation and Ion Sputtering," *Semiconductor Science and Technology*, IOP, Bristol, GB, vol. 19, No. 2, Feb. 1, 2004, pp. 213-218.
Compaan, A.D., et al., "CdS/CdTe solar cells by RF sputtering and by laser physical vapor deposition," *Proceedings of the Photovoltaic Specialists Conference.* Louisville, May 10-14, 1993, New York, IEEE, U.S., vol. Conf. 23, May 10, 1993, pp. 394-399.
Milde, F., et al., "Large-Area Production of Solar Absorbent Multilayers by MF-Pulsed Plasma Technology," Vacuum, Pergamon Press, GB, vol. 59, No. 2/03, Nov. 1, 2000, pp. 825-835.
International Search Report in PCT/EP2008/062383 dated Mar. 24, 2009.
First Office Action in Chinese Application No. 200880118729.1, dated Aug. 9, 2011.

* cited by examiner

*Primary Examiner* — Richard A. Booth
(74) *Attorney, Agent, or Firm* — Marshall, Gerstein & Borun LLP

(57) ABSTRACT

A process for preparing a solar cell comprising a support, a layer of cadmium sulfide (CdS), a layer of cadmium telluride (CdTe), a layer of a transparent conductive oxide (TCO), a conductive metallic layer and optionally a layer of buffer material, the CdS layer and the CdTe layer being deposited by means of a pulsed plasma deposition (PPD) method, a solar cell obtainable by means of the described process being also provided.

34 Claims, 2 Drawing Sheets

PROCESS FOR PREPARING A SOLAR CELL

TECHNICAL FIELD

The present invention relates to a process for preparing a solar cell based on thin layers of cadmium sulfide (CdS) and cadmium telluride (CdTe).

BACKGROUND ART

Cadmium telluride is a photoactive material which has revealed itself to be particularly suitable for manufacturing solar cells, since it is characterized by a so-called "energy gap" with a value of 1.45 eV which is highly favorable. Moreover, polycrystalline layers of CdTe with a thickness of a few micrometers (μm) can be deposited easily by way of several technologies, including Physical Vapor Deposition (PVD), Chemical Vapor Deposition (CVD), Close-Space Sublimation (CSS), screen-printing, spray methods and others. However, such technologies require generally a certain type of treatment after deposition in order to optimize the properties of the active layers of the cell.

CdTe was used for the first time in the manufacture of solar cells in the 1960s and, at the end of the 1970s, the efficiency of such cells had reached a value of 9%. The production process used entails doping the CdTe by introducing oxygen in the material deposition step, working at high temperatures (560-580° C.). A post-deposition treatment in an oxygen atmosphere also contributes to a further 1-2% increase in terms of efficiency. However, this process has revealed itself to be scarcely practical, since it is scarcely controllable and expensive, especially due to the high costs of the substrates made of heat-resistant glass required for the procedure.

Subsequently, in the 1980s, a method for CdTe deposition of the Closed Space Vapor Transport (CSVT) type was developed. This process utilizes the favorable properties of the heat-resistant glass support, which is heated rapidly to the temperature of 650° C. The CdTe is then deposited by the source heated at 600° C.

Deposition methods of the electrolytic type were also developed in the 1980s. In this case, an aqueous solution of $CdSO_4$ and $Te_2O_3$ at the temperature of 90° C. is used. However, such electrolytic methods require long times for deposition, since the deposition rate must be kept low in order to avoid the development of fluctuations in the stoichiometry of the CdTe layer.

Screen-printing technology instead uses a suspension of particles of Cd and Te dust, which is deposited on the support and then converted into a relatively thick CdTe layer by means of a thermal treatment at high temperatures (above 700° C.). In this case also, the method is expensive due to the cost of the suitable substrates.

Deposition methods of the spray type utilize an aqueous solution of components which contain Cd and Te, which is atomized and deposited in the form of droplets onto the support, which is heated to 400° C. Since the CdTe layer that is deposited tends to form porous structures, the deposition must lead to the formation of a thick layer, which can help prevent the subsequent permeation, within the cavities of the CdTe layer, of the material that constitutes the layers to be deposited later. This aspect, combined with the great quantity of material that is wasted during the atomization step, causes spray methods to be relatively onerous.

There is, therefore, the need to develop a process for preparing a solar cell based on CdS and CdTe in which low-cost precursors are used in quantities which are not excessive, in which relatively low temperature conditions are used, and which can be applied easily in the industrial sector to allow inexpensive mass-production of solar cells.

DISCLOSURE OF THE INVENTION

The aim of the present invention is to provide a process for preparing solar cells based on CdS and CdTe which is inexpensive and simple to provide.

Within this aim, an object of the invention is to provide a process which can be implemented easily in the industrial field.

Another object of the invention is to provide a process which is highly reliable, relatively easy to carry out and at competitive costs.

This aim and these and other objects which will become better apparent hereinafter are achieved by a process for preparing a solar cell comprising a support, a layer of cadmium sulfide (CdS), a layer of cadmium telluride (CdTe), a layer of a transparent conductive oxide (TCO), a conductive metallic layer and optionally a layer of buffer material, characterized in that the CdS layer and the CdTe layer are deposited by means of a pulsed plasma deposition (PPD) method.

Moreover, the aim and objects of the invention are also achieved by a solar cell which can be obtained according to the process of the invention.

BRIEF DESCRIPTION OF THE DRAWINGS

Further characteristics and advantages of the invention will become better apparent from the description of a preferred but not exclusive embodiment of the process and of the solar cell according to the invention, illustrated by way of non-limiting example in the accompanying drawings, wherein.

WAYS OF CARRYING OUT THE INVENTION

Figure 1A:
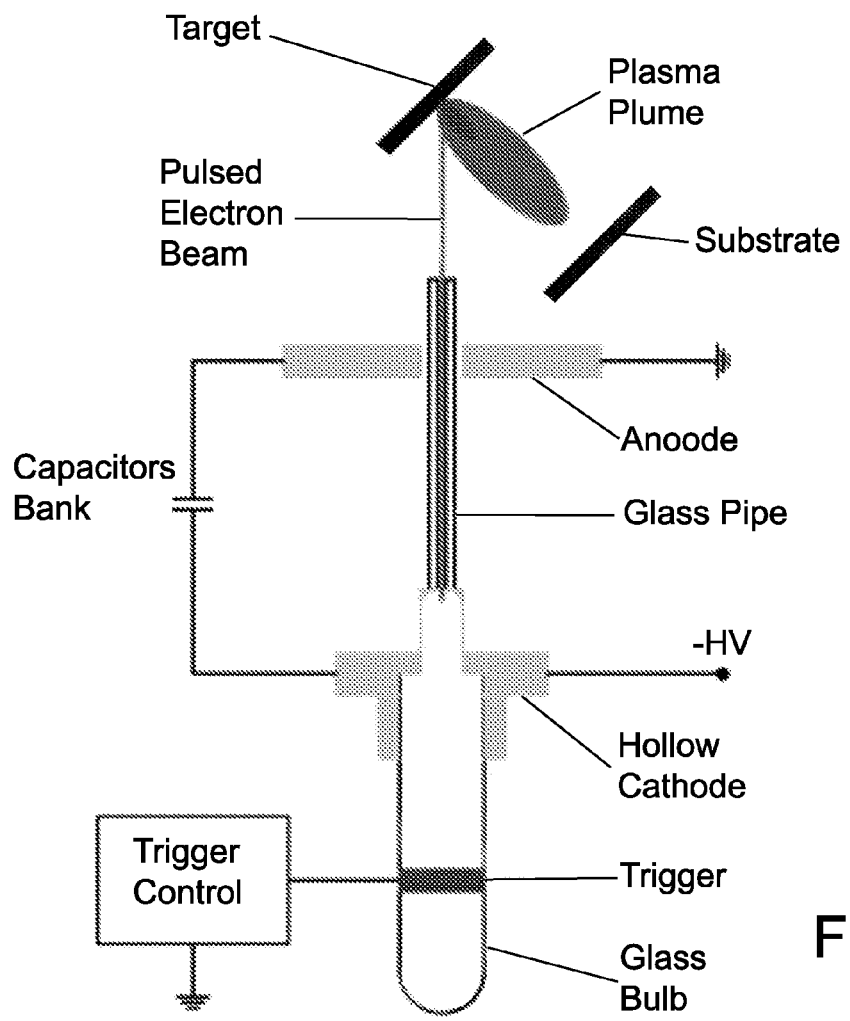
FIG. 1a is a diagram of a device which works according to the PPD method, suitable to perform the process according to the invention.
Figure 1B:
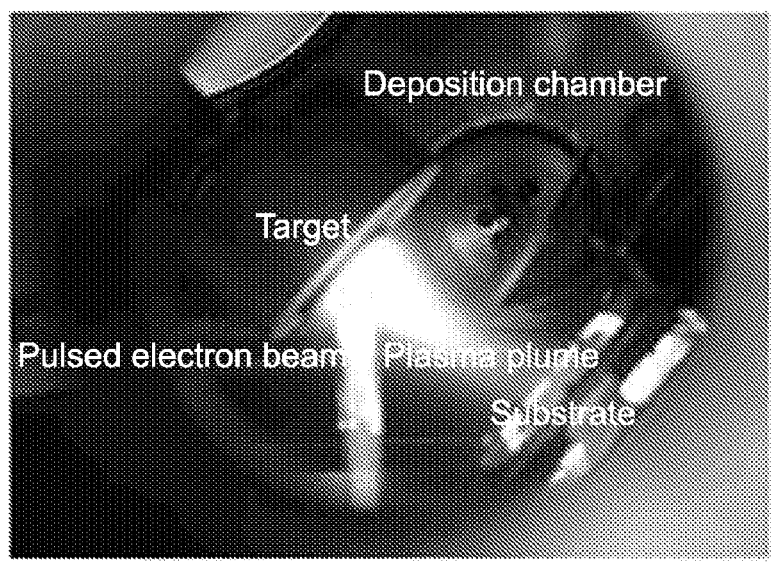
FIG. 1b is a view of the ablation and plasma generation effect on the part of a PPD device on a target, in which it is possible to notice the primary plasma of the electron pulse in the glass capillary and the secondary plasma of material of the target created by microexplosion caused by the arrival of the electron pulse on the surface of the target.
Figure 2:
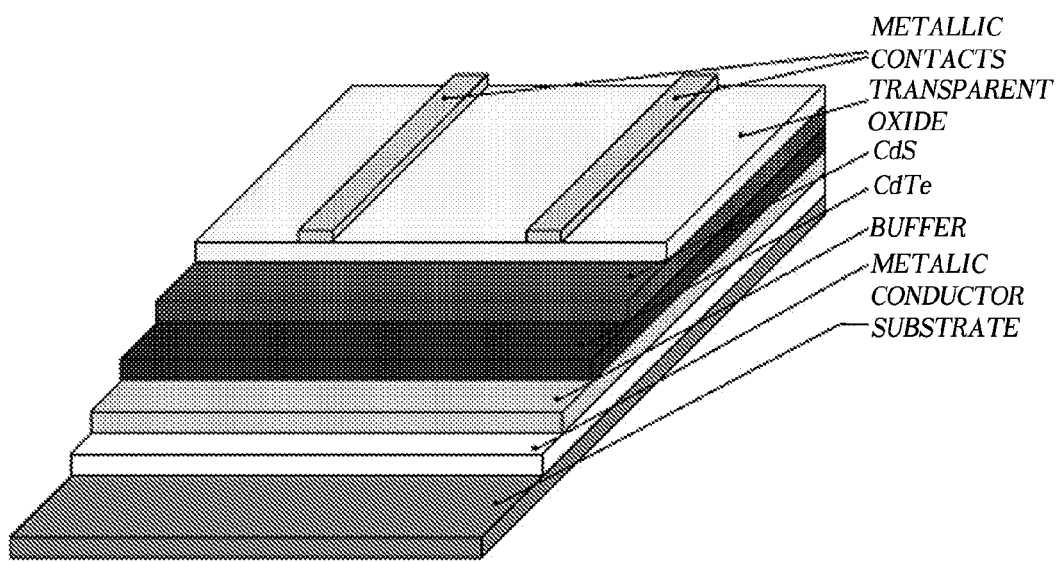
FIG. 2 is a diagram of a solar cell which can be obtained according to an embodiment of the process according to the invention.
Figure 3:
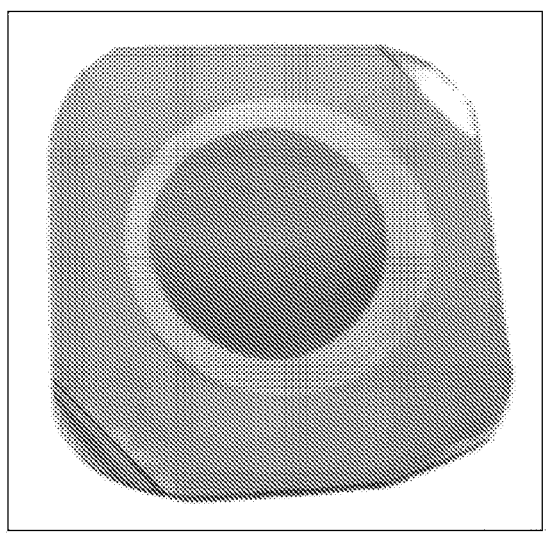
FIG. 3 is a photograph of a solar cell which can be obtained according to an embodiment of the process according to the invention.

In one of its aspects, the present invention relates to the deposition of layers of photoactive materials (CdS and CdTe) and optionally layers of buffer materials by adapting a pulsed plasma deposition (PPD) technique based on the generation of pulses of electrons at high energy (up to 25 keV) and by the plasma created by a working gas, such as oxygen, argon or nitrogen, at low pressure (from $10^{-6}$ to $10^{-2}$ mbar), disclosed in EP 1867221 A2, assumed included herein by reference, together with an apparatus adapted to generate said pulses. The diagram of the apparatus used is shown in FIG. 1. Such apparatus comprises a first dielectric tube (glass bulb) which contains a gas, a hollow cathode connected to the first tube, a second dielectric tube (a glass tube) connected to the cathode and to a deposition chamber within which at least one target and a support are positioned, an anode which is arranged around the second dielectric tube, and means for applying a voltage to the cathode and to the anode (source of high voltage HV and capacitor bank).

The application of a suitable voltage and/or gas pressure leads to the generation of electrons and plasma near the hollow cathode.

The electrons and the plasma are then removed and accelerated with the electric potential difference (up to 25 kV) between the hollow cathode and anode and pass within the second dielectric tube in an equipotential region between the anode and the target. By means of the impact of the pulse of accelerated electrons on the surface of a target constituted by the material to be deposited, the energy of the pulse is transferred into the material of the target and causes its ablation, i.e., the explosion of its surface in the form of a plasma of material of the target, also known as "plume", which propagates in the direction of a support (substrate), where it is deposited (FIG. 1).

The ion conductivity of low-pressure gases ensures an electrostatic shielding to the space charge generated by the electrons. As a consequence of this, self-sustained beams can be accelerated with high energy density and power and directed against a target held at ground potential, thus causing explosions below the surface of the target which generate the expulsion of material from the target proper (ablation or "explosion sublimation" process), thus forming the plume, which propagates normally to the surface of the target.

Ablation depth is determined by the energy density of the beam, by the duration of the pulse, by the vaporization heat and by the thermal conductivity of the material that constitutes the target as well as by the density of the target proper.

The material of the plume, during its path between the surface of the target and of the support, interacts with the working gas that is present in the deposition chamber at low pressure (from $10^{-6}$ to $10^{-2}$ mbar) and can be as is or with the addition of oxygen, with the addition of argon, nitrogen or doped. It has been demonstrated that only a small part (approximately 1%) of the electrons of the pulse are accelerated by means of the full difference of the potential between the cathode and the anode. The energy of most of the electrons does not exceed 500 eV. The deposition rate of the material (film growth rate) can be controlled by means of the rate of generation of the electron pulses (repetition rate), the difference in potential between the cathode and the anode and the corresponding average current (approximately 3-50 mA) and by means of the distance between the target and the support.

Moreover, it is possible to optimize the growth of the film on the support by selecting and fixing the suitable temperature of the support, for example by means of a heater which is incorporated in the holder of the support.

Within the process according to the invention, a PPD method can be used to prepare solar cells based on CdS and CdTe materials. The cells comprise a support (substrate), a layer of transparent conductive oxide (TCO), a conductive metallic layer, the layers of CdS and CdTe, and optionally a layer of a buffer material, where the expression "buffer material" is used to reference a semiconductor material which is suitable to provide ohmic contact with the layer of CdTe and is therefore characterized by a work function higher than 5.7 eV.

The sequence (the order) according to which the layers that compose the cells are deposited can be "ordinary" or "reverse". Generally, for deposition according to the ordinary sequence the deposition techniques used so far have always required a rigid substrate, for example glass or another inorganic, transparent and heat-resistant material. This need arises from the need to ensure resistance to the high temperatures used in the thermal treatments of such techniques. The PPD method instead allows to use a rigid or flexible support onto which the subsequent layers that constitute the cell are deposited, regardless of the layer deposition sequence. Suitable rigid supports are for example a glass sheet, a quartz sheet or more generally a sheet of a rigid material which is heat-resistant and transparent. Examples of flexible supports are instead constituted by metal sheets or solid organic materials, such as for example polycarbonate (PC), polytetrafluoroethylene (PTFE) or polyethylene terephthalate (PET).

In one embodiment of the process according to the invention, the layers are deposited in the sequence identified here as "ordinary sequence". In the process for preparing a cell according to the "ordinary sequence", the support (for example a glass sheet) is first covered by a thin layer of transparent conductive oxide (TCO), such as for example indium-tin oxide (ITO, a mixture of $In_2O_3$ and $SnO_2$) or zinc oxide (ZnO). When the support is constituted by a glass sheet, it acts not only as a support for the structure of the solar cell but also as a transparent window for the inflow of light. The TCO layer constitutes the transparent front contact. A thin layer of CdS is deposited on the TCO layer and creates an ohmic contact with the underlying TCO and simultaneously creates the "n" part of the "p-n" interface of the structure used to separate the electrical charges generated by absorbing the photon in the "p" part of the semiconductor. The "p"-type semiconductor is constituted by a layer of CdTe deposited on the layer of CdS. Subsequently, a layer of buffer material can optionally be deposited on the CdTe layer. For example, the buffer material can be antimony telluride ($Sb_2Te_3$), zinc telluride (ZnTe), antimony (Sb), titanium selenide ($TiSe_2$), copper sulfides ($Cu_xS$), or nickel phosphide ($Ni_2P$). Preferably, the buffer material is $Sb_2Te_3$. The structure is completed by depositing a layer of metal which constitutes the rear contact.

However, resorting to a rigid support in preparing a solar cell according to the ordinary sequence may lead to a number of disadvantages and limitations in manufacture: a support such as a glass sheet, in the function as a window for the entry of the light into the cell, in fact can cause a substantial loss of the deposited energy; moreover, the rigidity of such support influences the possible applications for which the cells might be designed, preventing applications in which it is necessary to have flexible structures.

By way of the use of the PPD method, the process according to the invention can lead to the preparation of solar cells in which the layers of the cell are deposited according to a reverse order with respect to the ordinary sequence. A type of cell is thus obtained whose structure is defined hereinafter as "reverse sequence". To provide this type of cell, a metallic support or a material provided with a conductive metallic layer are used. Such support can be flexible (for example a metal sheet or a solid organic material such as PC, PTFE or PET) or rigid. In the case of a metallic support such as a metal sheet, it is capable of acting directly as an electrical contact. The choice of a flexible support gives the cell a flexible structure and allows easier processing. On the support, on which it is optionally possible to deposit a layer of buffer material (preferably $Sb_2Te_3$, ZnTe, Sb, $TiSe_2$, $Cu_xS$ or $Ni_2P$, even more preferably $Sb_2Te_3$), a layer of CdTe is deposited by means of a PPD method. Subsequently, a layer of CdS is deposited by means of a PPD method and finally a TCO layer is deposited. In particular, the TCO layer can be zinc oxide (ZnO), a material which has revealed itself to be particularly suitable as a transparent oxide for application to solar cells. By using zinc oxide as a transparent window for the cell, an increase in the efficiency of the cell by approximately 25% is achieved with respect to a cell in which the TCO is ITO; this is due to the higher transparency of zinc oxide to light in the part of the solar spectrum that corresponds to red and infrared. Moreover, it is possible to deposit a fine metal mesh of collectors of electrical charge (electrical contacts) by screen-printing. Finally, an additional thin layer of $SiO_x$ can be deposited, acting as a protective layer.

In the process according to the invention, both in preparing the cell with the ordinary structure and in preparing the cell with the reverse structure, the deposition of the CdS layer can be performed by using a target of pressed and unsintered CdS. Moreover, the step for depositing the CdS layer can be performed at a temperature from 200 to 550° C., preferably 300° C., in the presence of a deposition gas which comprises sulfur hexafluoride ($SF_6$) from 0.1 to 30% by volume and argon from 70 to 99.9% by volume, preferably 2% $SF_6$ by volume and 98% argon by volume, at a gas pressure ranging from $1\times10^{-3}$ to $1\times10^{-2}$ mbar, preferably ranging from $4\times10^{-3}$ to $5\times10^{-3}$ mbar and with an acceleration of the PPD method from 6 to 18 kV, preferably 8 kV. The thickness of the CdS layer can be from 40 to 150 nm, preferably 80 nm.

The deposition of the CdTe layer can be performed by using a pressed and unsintered target comprising 50 to 100% CdTe by weight, preferably 85% by weight, 0 to 40% tellurium chloride ($TeCl_4$) by weight, preferably 10% by weight, and 0 to 40% cadmium chloride ($CdCl_2$), preferably 5% by weight of $CdCl_2$. Moreover, the deposition of the layer of CdTe is performed at a temperature from 200 to 550° C., preferably 400° C., in the presence of a deposition gas which comprises 0 to 50% oxygen by volume and 50 to 100% argon by volume, preferably 10% oxygen by volume and 90% argon by volume, at a gas pressure ranging from $1\times10^{-3}$ to $1\times10^{-2}$ mbar, preferably $4\times10^{-3}$ mbar, and with an acceleration of the PPD method from 6 to 18 kV, preferably 8 kV. The deposited CdTe layer can have a thickness ranging from 0.5 to 15 µm, preferably from 3 to 8 µm, even more preferably 6 µm.

Following the deposition of the CdS and CdTe layers, heating is then performed at a temperature from 400 to 650° C., preferably 500° C., for 1 to 60 minutes, preferably 15 minutes, at a pressure from $1\times10^{-7}$ to $1\times10^{-5}$ mbar; preferably $1\times10^{-6}$ mbar. This step causes the recrystallization of the CdS layer, of the CdTe layer, the interdiffusion of sulfur and tellurium in the region of contact between CdS and CdTe, and the enrichment of the CdTe layer with tellurium.

The optional deposition of the buffer material can be performed by means of a PPD method and performed at a temperature from 200 to 550° C., preferably 300° C., in the presence of a deposition gas which comprises 100% argon by volume, at a gas pressure ranging from $1\times10^{-3}$ to $1\times10^{-2}$ mbar, preferably $3\times10^{-3}$ mbar, and with an acceleration of the PPD method from 6 to 18 kV, preferably 8 kV.

The metallic conductive layer can be provided by depositing a suitable metal (copper, molybdenum) or a conductive carbon or silver coating.

It has been found that PPD technology is compatible with all the deposited materials mentioned above; the material is transferred in the deposition process from the corresponding target to the support without modifications in terms of stoichiometry, crystalline structure and electron structure shape. Moreover, it has been observed that the interactions between the layers deposited with the PPD technique are comparable to those that exist between layers deposited by means of the "classic" methods (laser ablation, close-space sublimation, magnetron sputtering).

In particular, it has been observed that the rotation of the support during depositions leads to a high uniformity of the thickness of the composition and of the continuity of the layers. The rotation of the support in fact decreases substantially the presence of pinholes in the underlying layers and therefore increases the quality of the cell in terms of short circuits.

Moreover, the use of the "clean chamber" process, i.e., the deposition of the complete sequence of all the layers without exposing the surfaces of the individual layers to environmental conditions (especially moisture contained in the atmosphere), allows a further optimization of the solar cell. In particular, the "clean chamber" process can be implemented by using a target holder which can be positioned and contains all the targets required to prepare the cell.

A further contribution to the increase in efficiency of the cells is achieved by using ZnO as TCO. The comparison between a cell with ZnO and a cell with ITO reveals a 25% higher efficiency in the ZnO cell with respect to the same cell provided with ITO.

In practice it has been found that the process according to the invention fully achieves the intended aim, since it allows to provide a solar cell with active layers of CdS and CdTe rapidly, in non-drastic operating conditions and with a procedure which can be applied also on an industrial scale.

The process thus conceived is susceptible of numerous modifications and variations, all of which are within the scope of the appended claims; all the details may further be replaced with other technically equivalent elements.

In practice, the materials used, as well as the dimensions, may be any according to requirements and to the state of the art.

The disclosures in Italian Patent Application no. MI2007A001907, from which this application claims priority, are incorporated herein by reference.

The invention claimed is:

1. A process for preparing a solar cell comprising a support, a layer of cadmium sulfide (CdS), a layer of cadmium telluride (CdTe), a layer of a transparent conductive oxide (TCO), a conductive metallic layer and optionally a layer of buffer material, characterized in that the CdS layer and the CdTe layer are deposited by means of a pulsed plasma deposition (PPD) method.

2. The process according to claim 1, comprising the steps of:
   a) depositing, by means of the PPD method, a layer of CdS on a support which is covered by a layer of transparent conductive oxide (TCO);
   b) depositing, by means of the PPD method, a layer of CdTe on the layer of CdS;
   c) heating the layers of material deposited previously to a temperature from 400 to 650° C. for a time from 1 to 60 minutes, at a pressure from $1\times10^{-7}$ to $1\times10^{-5}$ mbar;
   d) depositing a conductive metallic layer on the CdTe layer.

3. The process according to claim 2, characterized in that a layer of buffer material is deposited, by means of the PPD method, on the CdTe layer before step d).

4. The process according to claim 1, comprising the steps of:
   a) depositing, by means of the PPD method, a layer of CdTe on a metallic support or on a support covered by a conductive metallic layer;
   b) depositing, by means of the PPD method, a layer of CdS on the layer of CdTe;
   c) heating the layers of material deposited previously to a temperature from 400 to 650° C. for 1 to 60 minutes, at a pressure from $1\times10^{-7}$ to $1\times10^{-5}$ mbar;
   d) depositing a layer of transparent conductive oxide (TCO) on the CdS layer.

5. The process according to claim 2, characterized in that it deposits, by means of the PPD method, a layer of buffer material on the support before step a).

6. The process according to claim 2 or 4, wherein the support is rigid or flexible.

7. The process according to claim 6, wherein the rigid support is selected from the group constituted by glass, quartz and an inorganic transparent and heat-resistant material.

8. The process according to claim 6, wherein the flexible support is selected from the group constituted by a metal sheet and a solid organic material.

9. The process according to claim 8, wherein the solid organic material is selected from the group constituted by polycarbonate (PC), polytetrafluoroethylene (PTFE) and polyethylene terephthalate (PET).

10. The process according to claim 2 or 4, wherein the deposition of the CdS layer is performed at a temperature from 200 to 550° C., in the presence of a deposition gas which comprises from 0.1 to 30% sulfur hexafluoride ($SF_6$) by volume and 70% to 99.9% argon by volume, at a gas pressure from $1\times10^{-3}$ to $1\times10^{-2}$ mbar and with an acceleration of the PPD method from 6 to 18 kV.

11. The process according to claim 10, wherein the temperature is 300° C.

12. The process according to claim 10, wherein the deposition gas comprises 2% $SF_6$ by volume and 98% argon by volume.

13. The process according to claim 10, wherein the gas pressure ranges from $4\times10^{-3}$ to $5\times10^{-3}$ mbar.

14. The process according to claim 10, wherein the acceleration of the PPD method is 8 kV.

15. The process according to claim 2 or 4, wherein the deposition of the CdTe layer is performed at a temperature from 200 to 550° C., in the presence of a deposition gas which comprises 0 to 50% oxygen by volume and 50 to 100% argon by volume, at a gas pressure from $1\times10^{-3}$ to $1\times10^{-2}$ mbar and with an acceleration of the PPD method from 6 to 18 kV.

16. The process according to claim 15, wherein the temperature is 400° C.

17. The process according to claim 15, wherein the deposition gas comprises 10% oxygen by volume and 90% argon by volume.

18. The process according to claim 15, wherein the gas pressure is $4\times10^{-3}$ mbar.

19. The process according to claim 15, wherein the acceleration of the PPD method is 8 kV.

20. The process according to claim 3 or 5, wherein the deposition of the layer of buffer material is performed at a temperature from 200 to 550° C., in the presence of a deposition gas which comprises 100% argon by volume, at a gas pressure from $1\times10^{-3}$ to $1\times10^{-2}$ mbar and with an acceleration of the PPD method from 6 to 18 kV.

21. The process according to claim 20, wherein the temperature is 300° C.

22. The process according to claim 20, wherein the gas pressure is $3\times10^{-3}$ mbar.

23. The process according to claim 20, wherein the acceleration of the PPD method is 8 kV.

24. The process according to claim 2 or 4, wherein the deposited CdS layer has a thickness ranging from 40 to 150 nm.

25. The process according to claim 24, wherein the thickness of the CdS layer is 80 nm.

26. The process according to claim 2 or 4, wherein the deposited CdTe layer has a thickness ranging from 0.5 to 15 μm.

27. The process according to claim 26, wherein the thickness of the CdTe layer is 6 μm.

28. The process according to claim 2 or 4, wherein the deposition of the CdTe layer is performed with a pressed and unsintered target which comprises 50 to 100% CdTe by weight, 0 to 40% telluride chloride ($TeCl_4$) by weight and 0 to 40% by weight of cadmium chloride ($CdCl_2$).

29. The process according to claim 28, wherein the target comprises 85% CdTe by weight, 10% $TeCl_4$ by weight, and 5% $CdCl_2$ by weight.

30. The process according to claim 2 or 4, wherein the step of heating the layers of material is performed at a temperature of 500° C. for 15 minutes at a pressure of $1\times10^{-6}$ mbar.

31. The process according to claim 1, wherein the TCO is selected from the group constituted by indium-tin oxide (ITO) and zinc oxide (ZnO).

32. The process according to claim 31, wherein the TCO is zinc oxide (ZnO).

33. The process according to claim 3 or 5, wherein the buffer material is selected from the group constituted by antimony telluride ($Sb_2Te_3$), zinc telluride (ZnTe), antimony (Sb), titanium selenide ($TiSe_2$), copper sulfides ($Cu_RS$) or nickel phosphide ($Ni_2P$).

34. The process according to claim 33, wherein the buffer material is antimony telluride ($Sb_2Te_3$).

* * * * *